US006628048B2

United States Patent
Moon et al.

(10) Patent No.: US 6,628,048 B2
(45) Date of Patent: Sep. 30, 2003

(54) CRYSTAL OSCILLATOR WITH IMPROVED SHOCK RESISTANCE

(75) Inventors: Yang Ho Moon, Kyungki-do (KR); Doo Yeoul Yang, Kyungki-do (KR); Hong Wook Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/833,592

(22) Filed: Apr. 13, 2001

(65) Prior Publication Data

US 2002/0096974 A1 Jul. 25, 2002

(30) Foreign Application Priority Data

Nov. 29, 2000 (KR) ........................................ 2000-71505
Dec. 5, 2000 (KR) ........................................ 2000-73236

(51) Int. Cl.[7] .......................... H02N 2/00; H01L 41/04; H01L 41/08; H01L 41/18
(52) U.S. Cl. ........................ 310/348; 310/311; 310/310
(58) Field of Search ............................ 310/348, 311, 310/310, 300

(56) References Cited

U.S. PATENT DOCUMENTS

| 2,133,647 A | * | 10/1938 | Pierce .......................... 310/350 |
| 4,047,129 A | * | 9/1977 | Ishiyama ........................ 333/72 |
| 4,135,108 A | * | 1/1979 | Besson .......................... 310/344 |
| 4,293,986 A | * | 10/1981 | Kobayashi et al. .......... 29/25.35 |
| 4,334,168 A | * | 6/1982 | Besson et al. ................ 310/343 |
| 4,734,608 A | * | 3/1988 | Takoshima .............. 310/313 R |
| 5,453,652 A | * | 9/1995 | Eda et al. ................ 310/313 R |
| 5,548,178 A | * | 8/1996 | Eda et al. .................... 310/349 |
| 5,623,236 A | * | 4/1997 | Yoshinaga et al. ........... 333/187 |
| 5,821,665 A | * | 10/1998 | Onishi et al. ........... 310/313 R |
| 5,841,217 A | * | 11/1998 | Kizaki et al. ................ 310/348 |
| 5,920,142 A | * | 7/1999 | Onishi et al. ........... 310/313 R |
| 6,046,529 A | * | 4/2000 | Yoshida et al. .............. 310/348 |
| 6,274,968 B1 | * | 8/2001 | Wajima et al. ............... 310/348 |
| 6,307,300 B1 | * | 10/2001 | Yamamoto et al. .......... 310/322 |
| 6,433,466 B2 | * | 8/2002 | Wajima ....................... 310/344 |
| 6,445,254 B1 | * | 9/2002 | Shibuya et al. ............... 331/68 |
| 6,447,887 B1 | * | 9/2002 | Claus et al. .................. 428/209 |
| 6,472,797 B1 | * | 10/2002 | Kishimoto ................... 310/324 |
| 6,472,798 B2 | * | 10/2002 | Kishimoto ................... 310/344 |
| 6,507,139 B1 | * | 1/2003 | Ishino et al. ................. 310/348 |
| 6,541,897 B2 | * | 4/2003 | Endoh ......................... 310/344 |
| 6,545,392 B2 | * | 4/2003 | Kawauchi et al. ........... 310/344 |
| 6,545,393 B2 | * | 4/2003 | Oguri et al. ................. 310/348 |

FOREIGN PATENT DOCUMENTS

| JP | 09-107863 | 4/1997 | |
| JP | 2002198768 A | * 7/2002 | ............ H03H/9/09 |

OTHER PUBLICATIONS

Patent Abstract of JP Publication No. 10–303646: Nov. 13, 1998, Patent Application No. 09–107863.

* cited by examiner

*Primary Examiner*—Karl Tamai
*Assistant Examiner*—Pedro J. Cuevas
(74) *Attorney, Agent, or Firm*—Lowe Hauptman Gilman & Berner, LLP

(57) ABSTRACT

A crystal oscillator with an improved shock resistance is disclosed. A pair of supporting protuberances protrude within an oscillator main body. A conductive adhesive is spread on the pair of the supporting protuberances, and a quartz blank is bonded to the supporting protuberances across the conductive adhesive. Further, an insulating resin layer is disposed between the quartz blank and a cover so as to elastically press down the conductive adhesive. Further, the length of the connecting parts between the supporting part and the bridge parts is more extended to a certain degree, so that any stress imposed on them can be dispersed.

14 Claims, 7 Drawing Sheets

CRYSTAL OSCILLATOR WITH IMPROVED SHOCK RESISTANCE

FIELD OF THE INVENTION

The present invention relates to a crystal oscillator with an improved shock resistance, in which a quartz blank of a crystal oscillator (which is made to oscillate at a constant frequency regardless of the temperature variation by utilizing the temperature stability characteristic and the piezoelectricity) is bonded to a cover by using a conductive adhesive, and the lengths of connecting parts and bridge parts are slightly extended so as to effectively disperse the stress of the connecting parts, so as to prevent the ruptures of the crystal oscillator upon receiving an impact, and so as to prevent the bonding defects, thereby improving the shock resistance.

BACKGROUND OF THE INVENTION

When the generally known crystal oscillator is installed in a mobile phone, it is made to be oscillated at a constant frequency regardless of the temperature variation by utilizing the temperature stability characteristic and the piezoelectricity.

In this crystal oscillator, the resonance frequency can be made to have a relatively low frequency band by using a bridge part which has a curved mode.

Under this condition, in this crystal oscillator, two bridge parts are symmetrically formed so as to achieve a perfect securing, and thus, the frequency distortions due to the supporting part are almost eliminated.

Such a crystal oscillator is illustrated in FIG. 1.

As shown in this drawing, a pair of outer electrodes 10 are formed on the crystal oscillator 100, and a pair of supporting protuberances 30 protrude within a main body 20. A supporting part 60 of a quartz blank 50 is bonded onto the supporting protuberances 30 by using a conductive adhesive 40. An oscillator cover 70 is secured upon the quartz blank 50, thereby completing the crystal oscillator.

Under this condition, as shown in FIG. 2, the quartz blank 50 is constituted such that a pair of bridges 90 are integrally connected through a connecting part 80 to a supporting part 60.

In the above described crystal oscillator, the supporting part 60 of the quartz blank 50 is bonded onto the supporting protuberances 30 by using a conductive adhesive 40.

Then the oscillator cover 70 is secured to the top of the quartz blank 50, thereby completing the crystal oscillator.

However, in the crystal oscillator installed in the mobile phone or the like, the quartz blank 50 which is installed within the oscillator main body 20 is very brittle. Therefore, the connecting part 80 of the quartz blank 50 is easily ruptured upon receiving an impact as result of dropping or the like. Thus the crystal oscillator becomes defective very frequently.

Particularly, the quartz blank 50 is bonded onto the supporting protuberances 30 simply by using a conductive adhesive 40, and therefore, the bonded portion comes apart even under a weak impact.

SUMMARY OF THE INVENTION

The present invention is intended to overcome the above described disadvantages of the conventional technique.

Therefore it is an object of the present invention to provide a crystal oscillator with an improved shock resistance, in which an insulating resin is spread between a quartz blank and a cover, thereby reaping a shock resistant effect, and preventing the bonding defects and ruptures of the quartz blank.

It is another object of the present invention to provide a crystal oscillator with an improved shock resistance, in which bridge parts and connecting parts (between the bridge parts and the supporting part) are considerably extended so as to effectively disperse external impacts, so as to prevent the ruptures of the connecting part, and so as to prevent the crystal oscillator from being turned defective.

In achieving the above objects, the crystal oscillator with an improved shock resistance according to the present invention includes: an oscillator main body with a pair of supporting protuberances formed therein, a conductive adhesive being spread on the supporting protuberances; a quartz blank with its supporting part bonded onto the conductive adhesive of the supporting protuberances; a cover secured upon the quartz blank; and an insulating resin layer spread between the cover and the quartz blank, for elastically pressing down the conductive adhesive.

In another aspect of the present invention, the crystal oscillator with an improved shock resistance according to the present invention includes: a supporting part; a pair of connecting parts extended from the supporting part; and a pair of bridge parts elongately extending from the connecting parts, characterized in that: the width of each of the connecting parts is longer than a width of each of the bridge parts, wherein an outer edge of each of the connecting parts consist of a parallel part which is straightly extended from an outer edge of the supporting parts and a slant to an outer edge of the bridge parts.

BRIEF DESCRIPTION OF THE DRAWINGS

The above objects and other advantages of the present invention will become more apparent by describing in detail the preferred embodiment of the present invention with reference to the attached drawings, in which.

DESCRIPTION OF THE PREFERRED EMBODIMENT

The present invention will be described in detail referring to the attached drawing.

Figure 1:
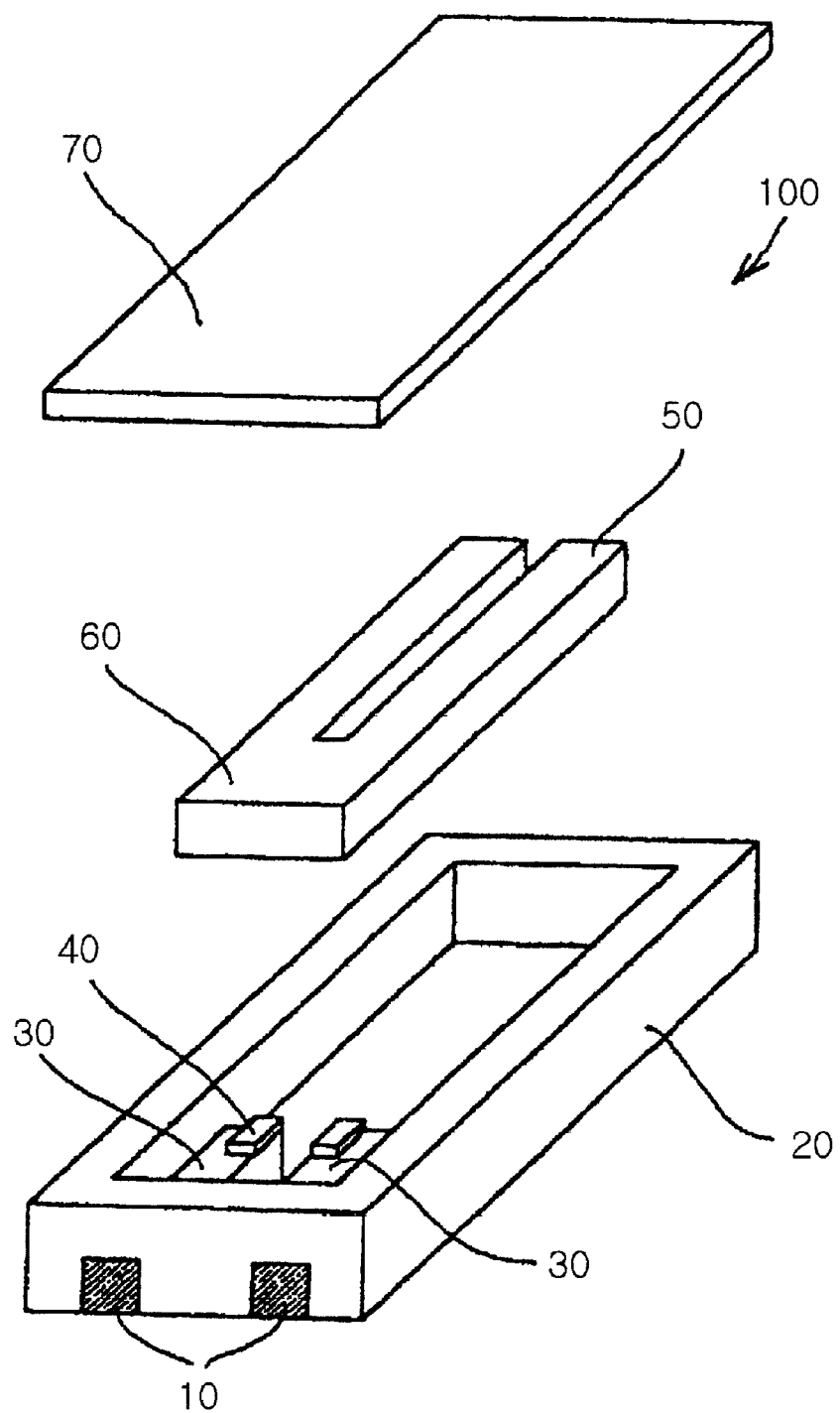
FIG. 1 is a schematic exploded perspective view of the conventional crystal oscillator.
Figure 2:
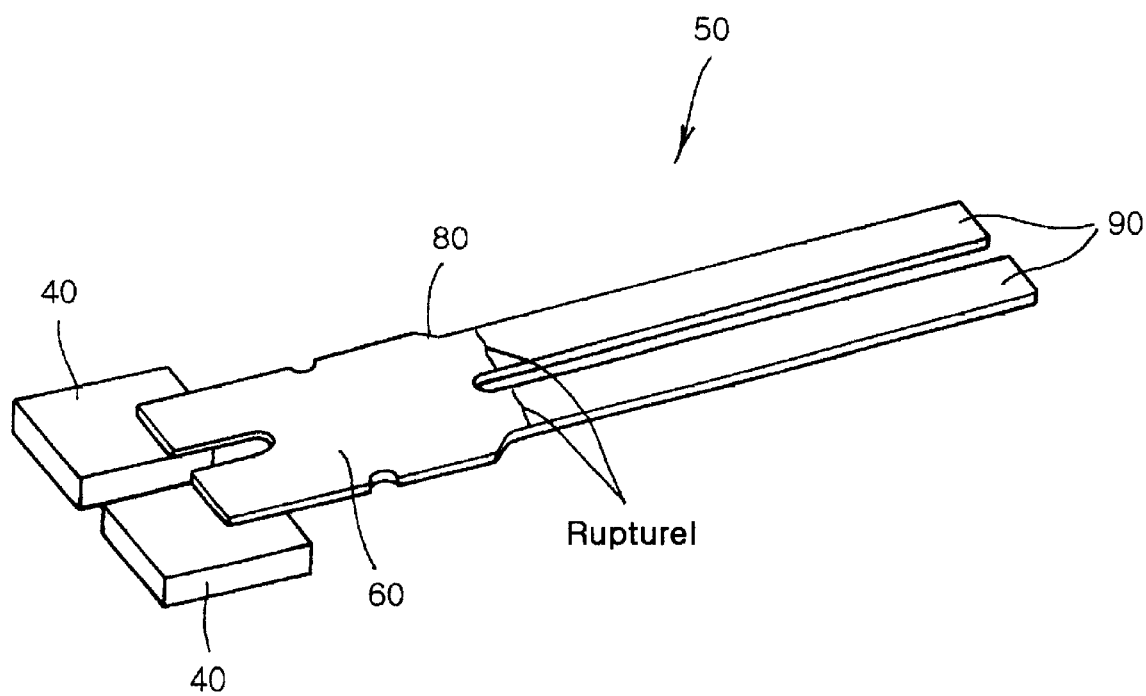
FIG. 2 is a schematic perspective view showing the quartz blank of the conventional crystal oscillator.
Figure 3:
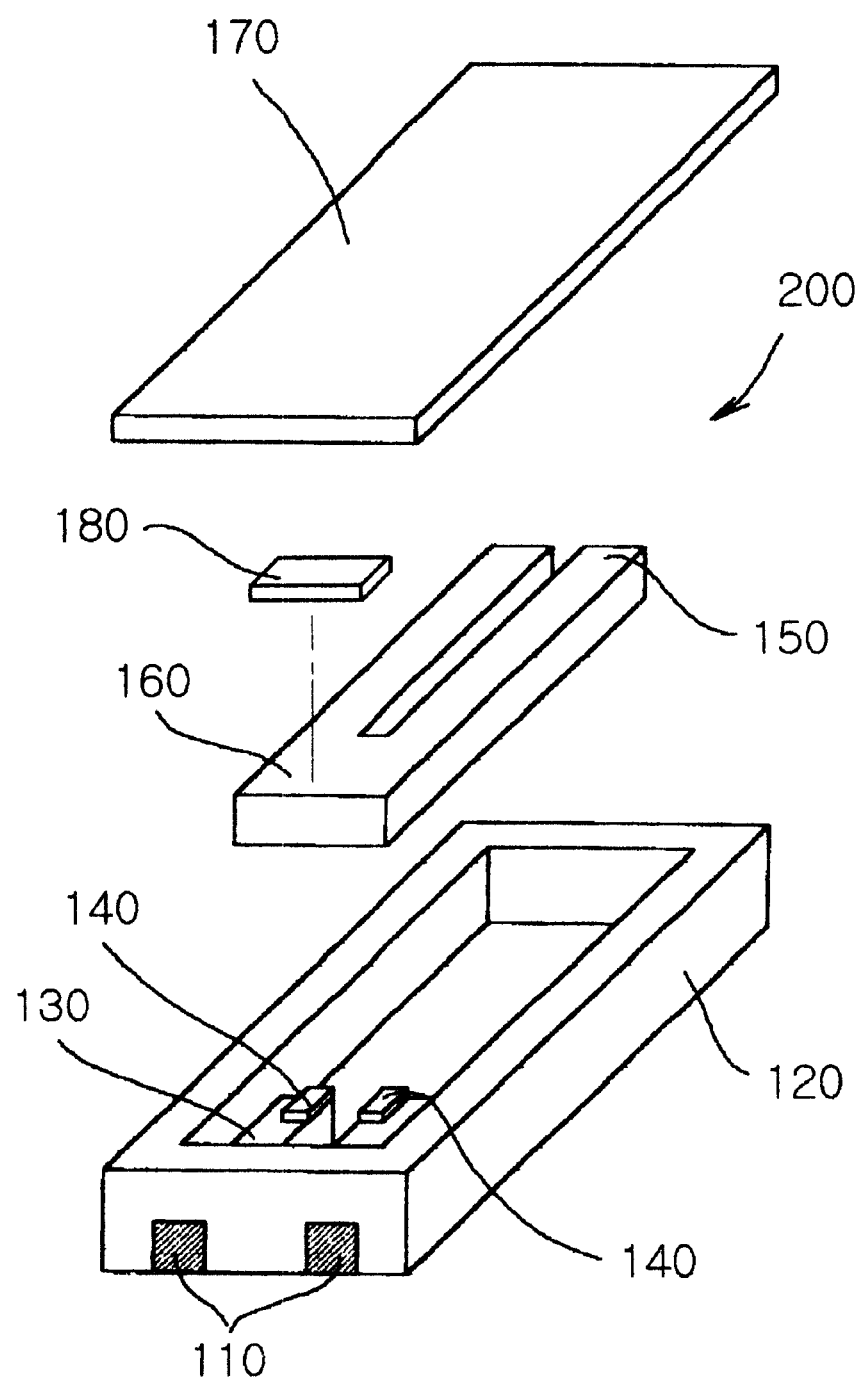
FIG. 3 is a schematic exploded perspective view of the crystal oscillator according to the present invention.
Figure 4:
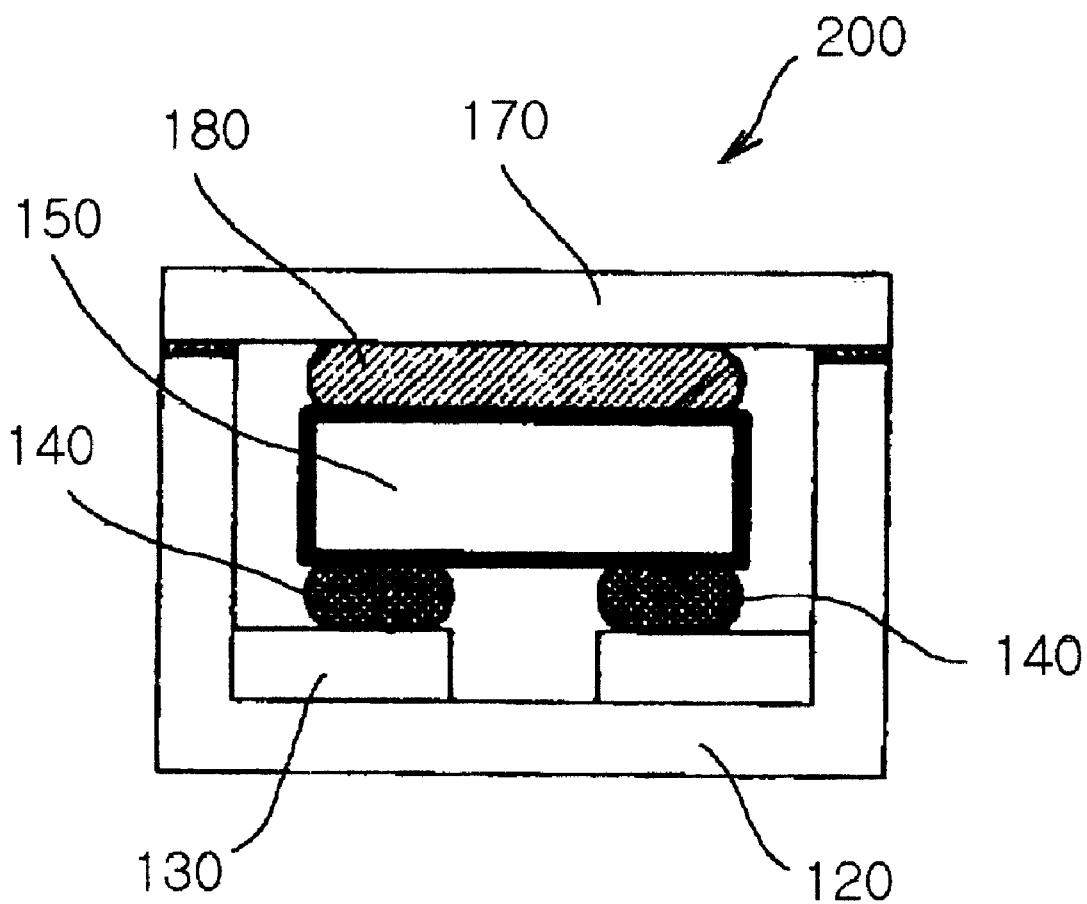
FIG. 4 is a frontal view showing the coupled structure of the crystal oscillator according to the present invention, in which the shock resistance is improved.

FIG. 3 is a schematic exploded perspective view of the crystal oscillator according to the present invention. FIG. 4 is a frontal view showing the coupled structure of the crystal oscillator according to the present invention, in which the shock resistance is improved.

The crystal oscillator 200 has a pair of outer electrodes 110 on its front face, and a pair of supporting protuberances 130 are formed within an oscillator main body 120.

A conductive adhesive is spread on the pair of the supporting protuberances 130 of the oscillator main body 120, and a supporting part 160 of a quartz blank 150 is bonded the supporting protuberances 130.

An insulating resin layer 180 is formed between the supporting part 160 of the quartz blank 150 and a cover 170 so as to press down the conductive adhesive which has been spread between the supporting protuberances 130 and the supporting part 160 of the quartz blank 150. Thus the cover 170 is secured upon the oscillator main body 120.

Figure 6:
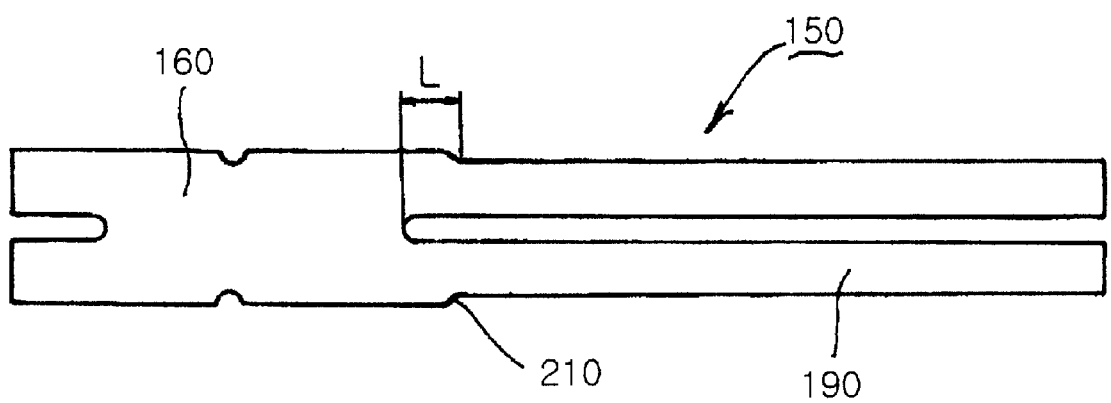
FIG. 6 is a plan view showing the quartz blank of the crystal oscillator according to the present invention, in which the shock resistance is improved.

FIG. 6 is a plan view showing the quartz blank of the crystal oscillator according to the present invention, in which the shock resistance is improved.

Each of connecting parts 210 which integrally connect a pair of bridge parts 190 to the supporting part 160 of the quartz blank 150 is made to have an extended length L, so that the stress imposed on the connecting parts 210 can be dispersed.

Now the present invention constituted as above will be described as to its action and effects.

As shown in FIGS. 3 and 4, in the crystal oscillator with the outer electrodes, in the case where the quartz blank 150 having an oscillating frequency characteristic is installed within the oscillator main body 120, a conductive adhesive consisting of mixture of silver (Ag) and a binder is spread on the pair of the supporting protuberances 130, thereby forming inner electrodes.

Under this condition, the supporting part 160 of the quartz blank 150 is bonded to the supporting protuberances 130 through the conductive adhesive 140.

As shown in FIG. 4, upon the supporting part 160 of the quartz blank 150 which is bonded on the supporting protuberances 130 through the conductive adhesive 140, there are formed an insulating resin layer 180 to elastically press down the conductive adhesive 140, so that the shock resistance of the oscillator can be improved in spite of the brittleness of quartz. Then the cover 170 is secured on the insulating resin layer 180.

Accordingly, owing to the insulating resin layer 180 which is spread on the supporting part 160 of the quartz blank 150, if the cover 170 is secured on the main body 120, then the conductive adhesive 140 is elastically pressed, with the result that the quartz blank 150 is not detached from the supporting protuberances 130 but is firmly attached.

Further, the insulating resin layer 180 which is disposed upon the quartz blank 150 serves as a shock absorber, and therefore, the quartz blank 150 can be prevented from being damaged upon receiving an impact as a result of a dropping or the like in spite of the brittleness of quartz.

Figure 5:
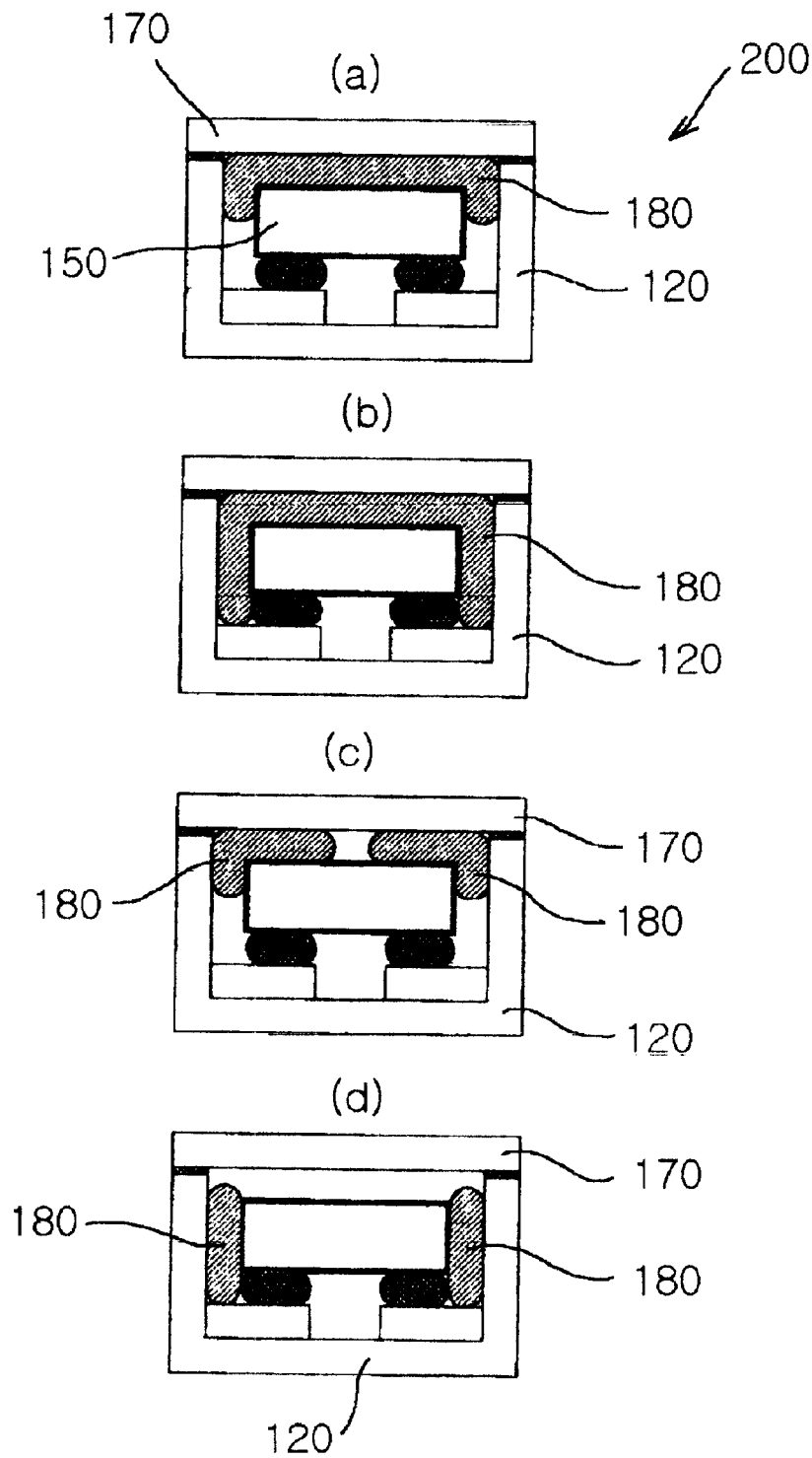
FIGS. 5a, 5b, 5c and 5d are frontal views respectively showing the coupled structures of the crystal oscillator according to the present invention.

FIGS. 5a, 5b, 5c and 5d are frontal views respectively showing the coupled structures of the crystal oscillator according to the present invention. As shown in FIGS. 5a and 5b, the insulating resin layer 180 is formed on the entire top and on parts of the sides of the quartz blank 150, or is formed on parts of the top and on parts of the sides of the quartz blank 150 (FIG. 5c), or is formed only on the sides of the quartz blank 150 (FIG. 5d). Thus the quartz blank 150 is protected.

FIG. 6 is a plan view showing the quartz blank of the crystal oscillator according to the present invention, in which the shock resistance is improved.

The supporting part 160 of the quartz blank 150 which is secured on the oscillator main body 120 of the crystal oscillator 200 is bonded to the pair of the supporting protuberances 130 of the oscillator main body 120 through the conductive adhesive 140.

Further, the two bridge parts which are integrally connected through the connecting parts 210 to the supporting part 160 extend in the horizontal direction in such a manner that the two bridge parts become symmetric to each other.

That is, the quartz blank 150 is constituted such that the supporting part 160 extends to the connecting parts 210, and the connecting parts 210 extend to form the two bridge parts 190.

Further, the width of each of the connecting parts 210 is wider than the width of each of the bridge parts 190.

Further, each of the mutually facing inner edges of the connecting parts 210 is straightly aligned with each of the mutually facing inner edges of the bridge parts 190.

Further, each of the outer edges of the connecting parts 210 consists of a parallel segment and a bent segment which is straightly bent down to the outer edge of the bridge part 190.

Thus, the connecting parts 210 which integrally connect the bridge parts 190 to the supporting part 160 are made to have a slightly extended length L, so that the stress caused by an external impact can be dispersed over the extended length L.

The length extension ratio of the connecting parts 210 to the bridge parts 190 should be preferably about 2.5~3.0:1, and more preferably should be about 2.78:1. In this manner, any ruptures of the connecting parts 210 due to external impacts can be prevented.

To describe it in more detail, the length L of the connecting parts 210 between the supporting part 160 and the bridge parts 190 is set to 270~290 $\mu$m. Further the width of the connecting parts 210 is made to be larger than the width of the bridge parts 190, compared with the conventional case in which if the width of the bridge parts is 218 $\mu$m, the length of the connecting parts is zero.

Thus the stress which is imposed by an external impact can be dispersed, so that any ruptures of the connecting parts 210 can be prevented.

At the same time, the length of the bridge parts 190 is extended by 90~105 $\mu$m, and is preferably extended by 99 $\mu$m compared with the conventional length, thereby adjusting the resonance frequency variation which is caused by the extension of the connecting parts 210.

That is, the width and the length of the connecting parts 210 are extended, and at the same time, the length of the bridge parts 190 are also extended, so that a resonance frequency same as that of the conventional crystal oscillator can be attained.

Under this condition, if the length L of the skewed connecting parts 210 is less than 270 $\mu$m, then a rupture-proof length of the connecting parts 210 cannot be obtained. On the other hand, if the length L of the connecting parts 210 is more than 290 $\mu$m, then the connecting parts 210 can also be easily ruptured.

Figure 7:
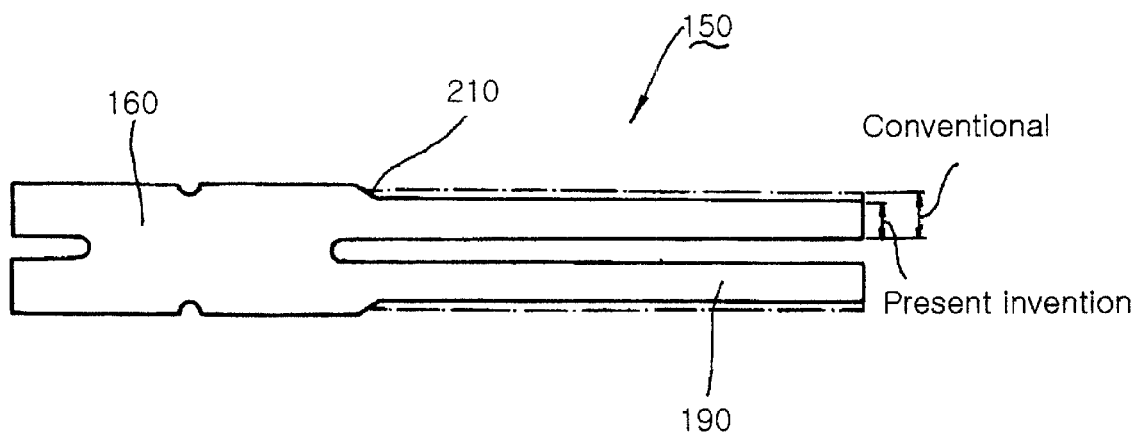
FIG. 7 illustrates the quartz blank in another embodiment of the present invention.

FIG. 7 illustrates the quartz blank in another embodiment of the present invention. As described above, the width and length of the connecting parts 210 of the quartz blank 150 are extended.

At the same time, the length of the bridge parts 190 is made same as that of the conventional one, while the width of the bridge parts 190 is decreased by a ratio of about 1/8~1/9 compared with the extension of the length of the connecting parts 210.

Preferably, the width of the bridge parts 190 is decreased by ⅛ compared with the extension of the length of the connecting parts 210. To define it more specifically, when the length of the connecting parts 210 is 275 μm, the width of the bridge parts 190 is made to be 184 μm which is equivalent to the conventional bridge part length 218 μm less 34 μm.

Thus, the length and width of the connecting parts 210 are extended to prevent the ruptures of the connecting parts 210, while the width of the bridge parts 190 is decreased to attain to the resonance frequency same as the conventional resonance frequency.

Meanwhile, the quartz blank 150 of the first and second embodiments were tested, and the test results are shown in Table 1 below. That is, the quartz blanks 150 of the first and second embodiments were dropped from a height of 1.5 m, and then, an FEM interpretation was carried out for the maximum stress which was imposed on the connecting parts 210 of the quartz blank 150.

TABLE 1

| Classification | | Maximum stress (MPa) | | |
|---|---|---|---|---|
| | Variation | Lengthwise | Width direction | Thickness direction |
| Conventional example | Length and width of connecting part: 0 | 134 (1.00) | 5.40 (1.00) | 239 (.100) |
| Example 1 | Length of connecting part: +99 μm | 110 (0.82) | 5.16 (0.96) | 198 (0.82) |
| Example 2 | Width of bridge part: −34 μm | 91 (0.68) | 5.24 (0.97) | 154 (0.64) |

The figures in the parenthesis are those for the case where the values of the conventional example are assumed to be 1.

As can be seen in Table 1 above, the rupture stress can be significantly reduced in both the first and second embodiments.

According to the present invention as described above, an insulating resin layer is formed between the quartz blank and the cover to elastically press down the conductive adhesive which is spread between the supporting protuberances and the quartz blank. Thus a shock absorbing effect can be reaped, and therefore, the ruptures of the connecting parts of the quartz blank can be prevented.

Further, the connecting parts and the bridge parts are extended to disperse the stress caused by an external impact, and therefore, the connecting parts of the quartz blank can be prevented from being ruptured upon receiving an impact by dropping or the like. Accordingly, the disorders of the applied apparatus can be prevented.

In the above, the present invention was described based on the specific preferred embodiments and the attached drawings, but it should be apparent to those ordinarily skilled in the that various changes and modifications can be added without departing from the spirit and scope of the present invention which will be defined in the appended claims.

What is claimed is:

1. A crystal oscillator with improved shock resistance, comprising:
   an oscillator housing with a pair of supporting protuberances formed therein;
   a conductive adhesive being spread on the supporting protuberances;
   a quartz blank having a supporting part bonded, via the conductive adhesive, on the supporting protuberances;
   a cover secured to the housing and positioned upon the quartz blank; and
   an insulating resin layer placed between the cover and the supporting part of the quartz blank, for elastically pressing down the conductive adhesive;
   wherein the insulating resin layer disposed upon the supporting part of the quartz blank is also formed between sides of the supporting part of the quartz blank and side walls of the housing.

2. A crystal oscillator with improved shock resistance, comprising:
   an oscillator housing with a pair of supporting protuberances formed therein;
   a conductive adhesive being spread on the supporting protuberances;
   a quartz blank having a supporting part bonded, via the conductive adhesive, on the supporting protuberances;
   a cover secured to the housing and positioned upon the quartz blank; and
   an insulating resin layer placed between the cover and the supporting part of the quartz blank, for elastically pressing down the conductive adhesive;
   wherein the insulating resin layer disposed upon the supporting part of the quartz blank extends along an entire top surface and entire side faces of the supporting part of the quartz blank.

3. A crystal oscillator with improved shock resistance, comprising:
   an oscillator housing with a pair of supporting protuberances formed therein;
   a conductive adhesive being spread on the supporting protuberances;
   a quartz blank having a supporting part bonded, via the conductive adhesive, on the supporting protuberances;
   a cover secured to the housing and positioned upon the quartz blank; and
   an insulating resin layer placed between the cover and the supporting part of the quartz blank, for elastically pressing down the conductive adhesive;
   wherein the insulating resin layer disposed upon the supporting part of the quartz blank partially covers a top surface and each of side faces of the supporting part of the quartz blank.

4. A quartz blank for use in a crystal oscillator with improved shock resistance, comprising:
   a supporting part;
   a pair of connecting parts longitudinally extended from the supporting part; and
   a pair of bridge parts each longitudinally extending from one of the connecting parts;
   wherein a width of each of the connecting parts is greater than a width of each of the bridge parts;
   wherein an outer longitudinal edge of each of the connecting parts consists of a parallel section which is straightly extended from an outer longitudinal edge of the supporting part and a slant section slanted with respect to an outer longitudinal edge of the bridge part.

5. The quartz blank as claimed in claim 4, wherein a length of the bridge parts is extended in proportion to a length of the connecting parts.

6. The quartz blank as claimed in claim 5, wherein a ratio of the length of the connecting ports to the extended length of the bridge parts is about 2.5~3.0:1.

7. The quartz blank as claimed in claim 4, wherein the about 1/8~1/5 of a length of the connecting parts.

8. A crystal oscillator with improved shock resistance, comprising:

an oscillator housing with a pair of supporting protuberances formed therein, and a conductive adhesive spread on the supporting protuberances;

a quartz blank comprising: i) a supporting part being bonded onto the supporting protuberances by the conductive adhesive; ii) a pair of connecting parts longitudinally extending from the supporting part; and iii) a pair of bridge parts each longitudinally extending from one of the connecting parts;

a cover being secured to the housing and positioned upon the quartz blank; and an insulating resin layer for elastically pressing down the conductive adhesive between the quartz blank and the supporting protuberances;

wherein a width of each of the connecting parts is greater than a width of the respective bridge part;

wherein an inside longitudinal edge of each of the connecting parts is straightly aligned with an inside longitudinal edge of the respective bridge part; and wherein an outer longitudinal edge of each of the connecting pails consists of a parallel section which is straightly extended from an outer longitudinal edge of the supporting part and a slant section slanted with respect to an outer longitudinal edge of the respective bridge part.

9. A crystal oscillator with improved shock resistance, comprising:

an oscillator housing with a pair of supporting protuberances formed therein;

a conductive adhesive being spread on the supporting protuberances;

a quartz blank having a supporting part bonded, via the conductive adhesive, on the supporting protuberances;

a cover secured to the housing and positioned upon the quartz blank;

an insulating resin layer placed between side walls of the housing and the supporting part of the quartz blank;

wherein the insulating resin layer is not present between the cover and a top surface of the supporting part of the quartz blank.

10. The quartz blank of claim 4, wherein an inner longitudinal edge of each of the connecting parts straightly extends from an inner longitudinal edge of the respective bridge part and is parallel with the parallel section of the outer longitudinal edge of said connecting part.

11. The quartz blank of claim 10, wherein the width of each of the bridge parts is substantially constant along an entire longitudinal extent thereof.

12. The quartz blank of claim 11, wherein the constant width of each of the bridge parts is about 1/8~1/5 of an entire longitudinal extent of the inner longitudinal edge of the respective connecting part.

13. The oscillator of claim 8, wherein the width of each of the bridge parts is substantially constant along an entire longitudinal extent thereof.

14. The oscillator of claim 9, wherein the cover and the housing together define a closed space, and all of the supporting protuberances, the conductive adhesive, the quartz blank, and the insulating resin layer are completely disposed within said closed spaced.

\* \* \* \* \*